United States Patent
Heintz et al.

(10) Patent No.: US 9,217,764 B2
(45) Date of Patent: Dec. 22, 2015

(54) MEASUREMENT AND MODULATION IN REAL TIME OF THE ELECTRICAL CONSUMPTION OF A PLURALITY OF ELECTRICAL APPLIANCES

(75) Inventors: Bruno Heintz, Paris (FR); Jean-Marc Oury, Paris (FR); Hugues Lefebvre De Saint Germain, Sainte-Foy-les-Lyon (FR); Pierre Bivas, Le Vesinet (FR); Mathieu Bineau, Versailles (FR)

(73) Assignee: VOLTALIS, Paris (FR)

( * ) Notice: Subject to any disclaimer, the term of this patent is extended or adjusted under 35 U.S.C. 154(b) by 95 days.

(21) Appl. No.: 14/232,355

(22) PCT Filed: Jul. 3, 2012

(86) PCT No.: PCT/FR2012/051536
§ 371 (c)(1),
(2), (4) Date: Apr. 10, 2014

(87) PCT Pub. No.: WO2013/011221
PCT Pub. Date: Jan. 24, 2013

(65) Prior Publication Data
US 2014/0232372 A1    Aug. 21, 2014

(30) Foreign Application Priority Data

Jul. 19, 2011 (FR) .................................... 11 56528

(51) Int. Cl.
*G01R 19/00* (2006.01)
*G01R 23/02* (2006.01)
*H02J 3/14* (2006.01)
*H02J 13/00* (2006.01)

(52) U.S. Cl.
CPC . *G01R 23/02* (2013.01); *H02J 3/14* (2013.01); *H02J 13/0079* (2013.01); *Y02B 70/3225* (2013.01); *Y02B 70/3266* (2013.01); *Y04S 20/222* (2013.01); *Y04S 20/224* (2013.01); *Y04S 20/242* (2013.01)

(58) Field of Classification Search
CPC ............... G01R 19/00; G01R 19/0092; G01R 19/0084; G01R 19/145; G01R 21/00; G01R 21/06; G01R 21/127; G01R 21/133; G01R 23/02; G01R 22/00; Y04S 20/222; Y04S 20/224; Y04S 20/242; Y04S 20/244; Y04S 20/248; Y04S 70/3225; Y04S 70/3266; H02J 2003/143
See application file for complete search history.

(56) References Cited

U.S. PATENT DOCUMENTS 6,487,509 B1 * 11/2002 Aisa ................................ 702/62
2005/0222784 A1 * 10/2005 Tuff et al. ....................... 702/61
(Continued)

FOREIGN PATENT DOCUMENTS

CN         101895121         11/2010

OTHER PUBLICATIONS

Search Report Dated 2012.

*Primary Examiner* — Son Le
(74) *Attorney, Agent, or Firm* — Sofer & Haroun, LLP

(57) ABSTRACT

A method is provided for measuring and modulating in real time the electrical consumption of electrical appliances. The method includes measuring in real time the current consumed by each of the electrical appliances on each electrical line portion on which each electrical appliance is situated and extracting the frequency and the voltage of the electrical signal on each electrical line portion. The difference in frequency are calculated and an alert signal is generated associated with an electrical line portion when the difference in frequency on this electrical line portion is greater than a predetermined frequency threshold value ($f_{threshold}$) and/or the difference in voltage on this electrical line portion is greater than a predetermined voltage threshold value ($V_{threshold}$).

5 Claims, 3 Drawing Sheets

(56) References Cited

U.S. PATENT DOCUMENTS

| | | |
|---|---|---|
| 2007/0220907 A1 | 9/2007 | Ehlers |
| 2008/0106146 A1* | 5/2008 | Baek et al. ............. 307/35 |
| 2010/0030391 A1 | 2/2010 | Oury et al. |
| 2010/0219808 A1 | 9/2010 | Steckley et al. |
| 2012/0226386 A1 | 9/2012 | Kulathu et al. |

\* cited by examiner

MEASUREMENT AND MODULATION IN REAL TIME OF THE ELECTRICAL CONSUMPTION OF A PLURALITY OF ELECTRICAL APPLIANCES

RELATED APPLICATIONS

This application is a National Phase Application of PCT/FR2012/051536, filed on Jul. 3, 2012, which in turn claims the benefit of priority from French Patent Application No. 11 56528 filed on Jul. 19, 2011, the entirety of which are incorporated herein by reference.

BACKGROUND

1. Field of the Invention

The present invention relates to a method and a system for measuring and modulating in real time the electrical consumption of a plurality of electrical appliances taking into account the frequency and voltage disturbances of the electrical lines of the distribution network powering these electrical appliances.

2. Description of Related Art

These days, the differences between electrical production and consumption lead to differences in the electrical voltage or frequency of the electrical distribution network. These differences can cause degradation to electrical appliances connected to the network when they are too great (typically above plus or minus 0.5 Hz around 50 Hz in France for the frequency, of the order of 10 to 15% for the voltage) and too frequent.

Document US 2010/0219808 discloses a system for measuring the voltage and/or the frequency of an electrical line by virtue of which the frequency and/or voltage differences can be compensated locally by the isolation or the activation of electrical appliances powered by this electrical line. More specifically, the measurement system comprises a central control device placed in a home and powered by an electrical line, this central control device being suitable for communicating with a plurality of control modules locally associated with one or more electrical appliances on a local communication network, for measuring the voltage and/or frequency anomalies of the electrical line, and for modulating the electrical power by acting locally on certain electrical appliances, that is to say by connecting or disconnecting, depending on the case, some of the electrical appliances.

Nevertheless, the above system only makes it possible to deal locally with the electrical line anomalies, by acting only on the electrical loads connected downstream of the measurement point, in this case, downstream of the central control device.

Also known is a system for measuring and modulating in real time the electrical consumption of a plurality of electrical appliances, the principle of which is described in the document WO 2008/017754 in the name of the Applicant. This measurement system comprises at least one modulator unit to which can be connected, individually or in series on current loops, a plurality of electrical appliances (such as water heaters, electrical radiators, air conditioners, etc). The modulator unit is suitable for measuring in real time the voltages and the currents consumed by these electrical appliances, and for periodically sending, for example every ten minutes, the measurements to an external platform hosted by an Internet server. This periodic sending of the measurements is performed through a wireless communication modem incorporated in a pilot unit of the system, the wireless communication modem allowing for a connection to the Internet platform that is of packet telephony type, such as GPRS, 3G or 4G. Alternatively, the connection to the Internet network can be made via a link of ADSL type. The pilot unit is preferentially distinct from the modulator unit and linked thereto by a wired link, preferably by powerline carrier or PLC. For this, each of the modulator and pilot units is equipped with a PLC modem. The pilot unit can thus be linked to a plurality of modulator units from which it collects the measurements for sending to the external platform. The pilot unit advantageously has a USB port which makes it possible to accept the connection of additional modules such as short range wireless modems or temperature sensors. Thus, it is also possible to provide for the transmission of the measurements from the modulator units to be performed by this radiofrequency pathway. The measurements received by the external platform are stored and can be viewed at any time and from any place by the user who can log on to his or her user space on the Internet by any known means. The platform is also likely to send, to the pilot unit, via the wireless connection of packet telephony type, commands to control the interruption of the power supply of all or some of the electrical appliances linked to the different modulator units for a predetermined time. The periods of interruption are generally less than half an hour, so that the users affected by the isolations of all or some of their electrical appliances, such as heaters or air conditioners, are not subjected to any inconvenience. The power supply is controlled via the modulator units.

By virtue of this system, and, furthermore, the possibility of tracking the consumptions by each user, it is possible to manage simultaneously, on the centralized platform, a large quantity of modulator units and pilot units and modulate more easily, on a communal, departmental, regional or national scale, the electrical power consumed by a set of users, in particular at the time of consumption peaks, without it being necessary for the electrical energy suppliers to produce more electricity.

Nevertheless, the system described in document WO 2008/017754 offers no solution to the abovementioned problem of frequency and/or voltage differences of the electrical distribution network.

OBJECTS AND SUMMARY

The aim of the present invention is to propose a system architecture of the type of that described in document WO 2008/017754 which makes it possible to offer a suitable response to the frequency and/or voltage disturbances likely to be present on the electrical distribution network. More specifically, the invention seeks a real time measurement and modulation system suitable for correcting the electrical power and frequency differences at the end of the line.

Thus, the subject of the present invention is a method for measuring and modulating in real time the electrical consumption of a plurality of electrical appliances powered from at least one electrical line of an electrical distribution network supplying a power feed signal at a nominal voltage and at a nominal frequency, characterized in that it comprises the following steps:

measuring, in real time, the current consumed by each of the electrical appliances on each electrical line portion on which each electrical appliance is situated;

extracting the frequency and the voltage of the electrical signal on each electrical line portion on which each electrical appliance is situated;

calculating the difference in frequency, as an absolute value, between the extracted frequency and the nominal frequency of the distribution network and/or the difference in voltage, as an absolute value, between the extracted voltage and the nominal voltage of the electrical distribution network for each electrical line portion;

generating an alert signal associated with an electrical line portion when the difference in frequency on this electrical line portion is greater than a predetermined frequency threshold value and/or the difference in voltage on this electrical line portion is greater than a predetermined voltage threshold value;

transmitting the electrical consumption of each of the electrical appliances and the alert signal to an external central platform;

sending, by said external central platform, selective isolation commands for certain electrical appliances, regardless of the position of these electrical appliances in relation to the electrical line portion for which the alert signal was generated.

Thus, the central platform can order corrective measures by taking into account frequency and/or voltage differences, which corrective measures will be able to be performed without distinction on electrical appliances situated downstream or upstream of the electrical line portion for which the alert signal was generated.

Also the subject of the present invention is a system for measuring and modulating in real time the electrical consumption of a plurality of electrical appliances powered from at least one electrical line of an electrical distribution network supplying a power feed signal at a nominal voltage and at a nominal frequency, the system comprising a plurality of modulator units comprising means for measuring in real time the current consumed by each of the electrical appliances on each electrical line portion on which each electrical appliance is situated, a plurality of pilot units suitable for locally exchanging data with one or more of said modulator units, and an external central platform hosted by an Internet server, suitable for exchanging data with said pilot units, the system being characterized in that:

said modulator units comprise means for extracting the frequency and the voltage of the electrical signal on each electrical line portion on which each electrical appliance is situated;

said modulator units or said pilot units comprise means for calculating the difference in frequency, as an absolute value, between the extracted frequency and the nominal frequency of the distribution network and/or the difference in voltage, as an absolute value, between the extracted voltage and the nominal voltage of the electrical distribution network for each electrical line portion and means for generating an alert signal associated with an electrical line portion when the difference in frequency on this electrical line portion is greater than a predetermined frequency threshold value and/or the difference in voltage on this electrical line portion is greater than a predetermined voltage threshold value;

in that the pilot units are suitable for transmitting the electrical consumption of each of the electrical appliances and the alert signal to the external central platform and in that said external central platform is suitable for sending selective isolation commands for certain electrical appliances, regardless of the position of these electrical appliances in relation to the electrical line portion for which the alert signal was generated.

According to other preferential features of the invention:

the external central platform is suitable for exchanging data with said pilot units via a wired communication link, notably an ADSL link, or a wireless communication link of GPRS, 3G or 4G type.

the pilot units are suitable for locally exchanging data with one or more of said modulator units via a wired communication link of powerline carrier type, or a short range radiofrequency communication link.

Alternatively, each pilot unit is incorporated in a modulator unit.

BRIEF DESCRIPTION OF THE DRAWINGS

Different aspects of the invention will become apparent in the following description, given with reference to the appended figures, in which.

DETAILED DESCRIPTION

Hereinafter in the description, the elements that are common to the different figures bear the same references.

Figure 1:
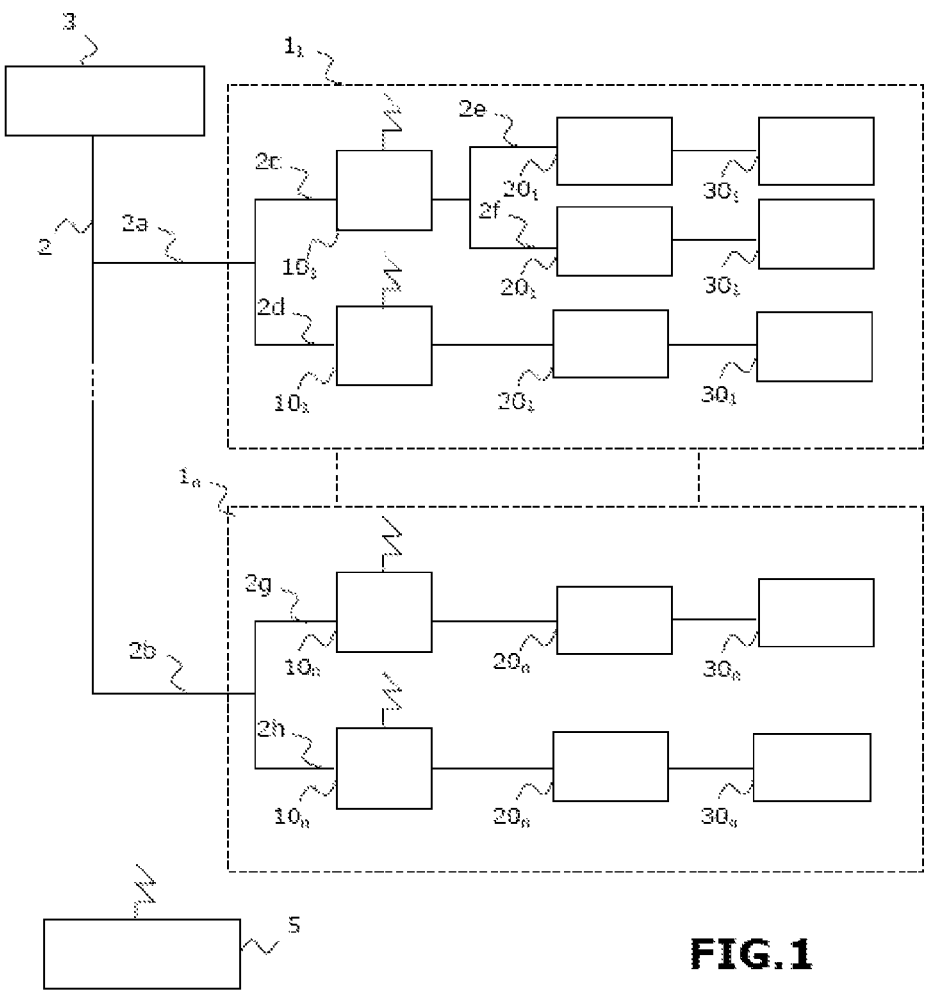
FIG. 1 schematically represents a portion of a system for measuring and modulating in real time the electrical consumption of a plurality of electrical appliances according to the invention.

FIG. 1 illustrates the architecture of a portion of a system for measuring and modulating in real time a plurality of electrical appliances. The portion of the system represented makes it possible, in the example illustrated, to manage a plurality of electrical appliances with which n buildings $1_1$ to $1_n$ are equipped, all powered from one and the same electrical line 2 at the output of an electrical transformer 3 of the electrical distribution network. In this example, the building $1_1$ is the one which is closest to the transformer, whereas the building $1_n$ is located at the end of the line. At least one modulator unit and one pilot unit are installed in each building. More specifically, the building $1_1$ comprises two pilot units $10_1$ and three modulator units $20_1$, each being linked to an electrical appliance $30_1$. One of the pilot units $10_1$ is linked to two modulator units $20_1$, whereas the other is linked only to a single modulator unit $20_1$. This configuration can, for example, correspond to an installation in two apartments of one and the same building, or else to two floors of a home. For its part, the building $1_n$ comprises two pilot units $10_n$, each linked to a modulator unit $20_n$, which is in turn linked to an electrical appliance $30_n$. Other configurations in each building can be envisaged, without departing from the scope of the invention. The references $2a$ and $2b$ represent the electrical line portions derived from the electrical line 2, and respectively powering the buildings $1_1$ and $1_n$. In the configuration illustrated, the line portion $2a$ is split into two sections $2c$ and $2d$ for respective links to each of the two pilot units $10_1$ of the building $1_1$. The line portion corresponding to the section $2c$ is also split into two sections $2e$ and $2f$. Finally, the line portion $2b$ relating to the building $1_n$ is split into two sections $2g$ and $2h$ for respective links to each of the two pilot units $10_n$ of the building $1_n$.

Each modulator unit $20_1$ and $20_n$ can exchange data with an external central platform 5 hosted by an Internet server via the pilot units $10_1$ and $10_n$ by a wired Internet link, notably an ADSL link, or by a wireless communication link of GPRS, 3G or 4G type.

Moreover, the pilot units $10_1$, $10_n$ are suitable for locally exchanging data with said modulator units $20_1$, $20_n$ to which they are linked via a wired communication link of powerline carrier type, or a short range radiofrequency communication link.

Figure 2:
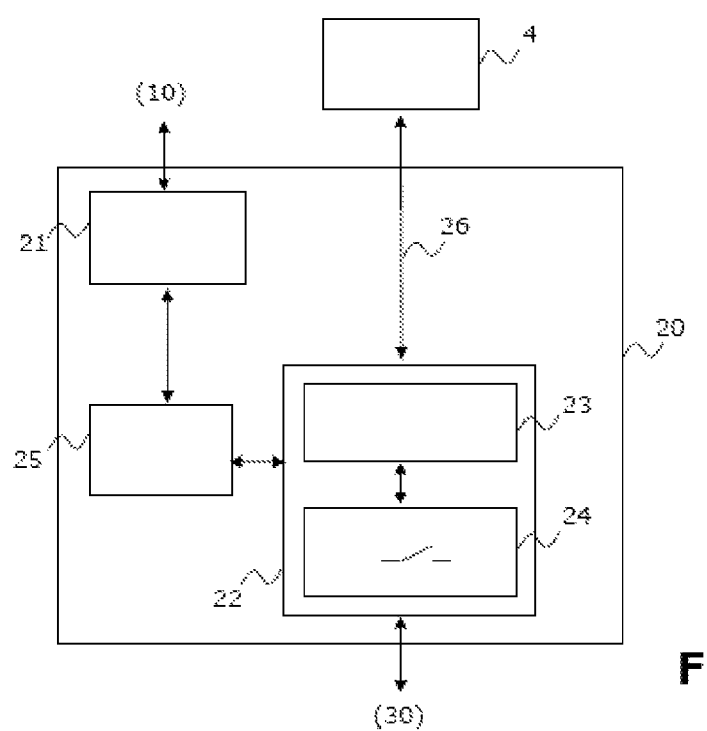
FIG. 2 schematically illustrates a modulator unit according to the invention.

FIG. 2 schematically illustrates the components of a modulator unit 20 according to a preferred embodiment of the invention. It will be recalled that a modulator unit 20 is suitable for being linked with a single pilot unit 10, but can be linked to a plurality of electrical appliances, typically up to four. In the example represented in FIG. 2, it is nevertheless assumed, to avoid overloading the figure, that the modulator unit 20 was connected only to a single electrical appliance 30. The modulator unit 20 typically comprises:

- a communication module 21 for managing two-way communications with the pilot unit 10 to which it is connected, typically a powerline carrier modem;
- an electrical control module 22 comprising a current measurement device 23, for example an induction loop, and an electrical relay 24 via which any commands to isolate the power supply to the electrical appliance 30 are relayed;
- a data processing module 25, in particular for collecting measurements output from the measurement device 23, for extracting measurement parameters, notably the voltage and the frequency of the line portion on which the modulator unit is situated, and for retaining the electrical measurement and interruption data. This module 25 is also suitable for receiving, via the pilot unit 10 to which it is linked and its communication module 21, instructions from the central platform 5 causing it to transmit the data, update the data acquisition and processing parameters on the basis on which it operates, and trip the electrical relay 24.
- a wired electrical link 26 for linking the modulator unit 20 to the electrical panel 4.

The structure schematically represented in FIG. 2 is applied to all the modulator units $20_1$ and $20_n$ included in the system represented by way of example in FIG. 1.

Figure 3:
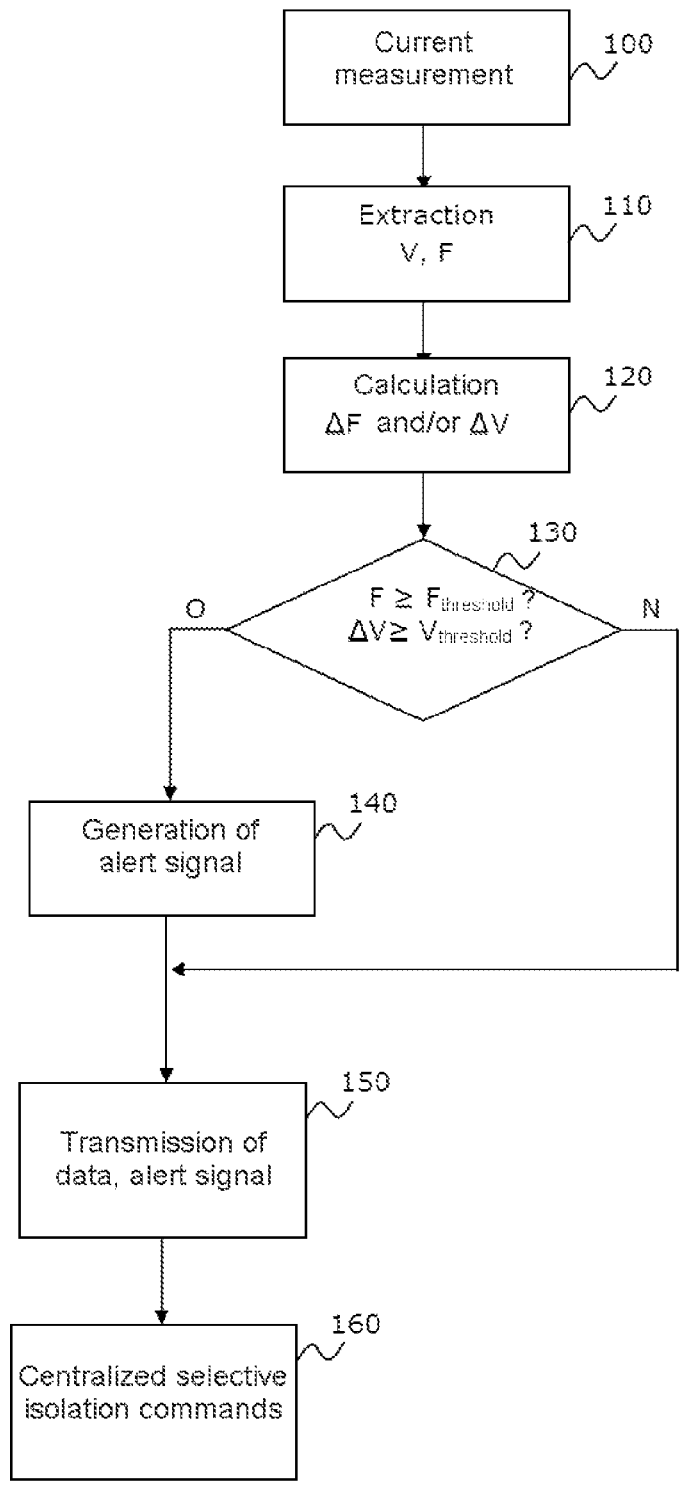
FIG. 3 represents different steps implemented in the method according to the invention.

The operation of the portion of system illustrated in FIGS. 1 and 2 will now be explained with reference to FIG. 3. Each modulator unit $20_1$ and $20_n$ measures in real time the currents consumed by the electrical appliances $30_1$ and $30_n$ (step 100) by virtue of its measurement device 23.

The data processing module 25 then extracts the voltage and the frequency of the signal on the electrical line portion where the measurement unit is situated (step 110). From the voltage and the current, each modulator unit can calculate in real time the power consumed by each electrical appliance to which it is linked.

The extraction of the frequency can be performed by different methods. In particular, the electrical signal tapped by the measurement device 23 is conventionally amplified if necessary, then converted into a squarewave signal via a Schmitt trigger (not represented). The frequency of the signal is estimated by counting the number of transitions of the square signal from 0 to 1 over a time dependent on the accuracy sought, for example over 10 seconds.

The data processing module 25 then proceeds, in a step 120, to calculate the difference, as an absolute value, between the extracted frequency and the nominal frequency of the distribution network (hereinbelow difference in frequency $\Delta f$), and/or to calculate the difference, as an absolute value, between the extracted voltage and the nominal voltage of the electrical distribution network (hereinbelow, difference in voltage $\Delta V$). The difference in frequency and/or the difference in voltage are then compared to predetermined threshold values $V_{threshold}$ and $f_{threshold}$ and stored in the data processing module 25 (step 130). As an example, for the French electrical distribution network (nominal voltage of 220 volts at the nominal frequency of 50 Hertz), the threshold value $V_{threshold}$ is of the order of 10 to 15% of 220 volts, and the threshold value $f_{threshold}$ is 0.5 Hertz. The data processing module 25 generates an alert signal when one of the differences is greater than the reference threshold value $V_{threshold}$ or $f_{threshold}$ (step 140). The different measurements of powers consumed, and the alert signals where appropriate, are transmitted to the central platform 5 (step 150).

The central platform 5 can then act locally, on certain appliances, to modulate the electrical power consumed by a set of users, and thus locally adjust in real time the electrical consumption against the production, by taking into account frequency and/or voltage differences. More specifically, the external central platform 5 will be able to transmit, in a step 160, selective isolation commands for certain electrical appliances, and do so regardless of the position of these electrical appliances in relation to the electrical line portion for which the alert signal was generated. In other words, the corrective measures will be able to be performed without preference on electrical appliances situated downstream or upstream of the electrical line portion for which the alert signal was generated.

By virtue of the system according to the invention, the measurement and modulation are performed on each appliance or group of electrical appliances, unlike the solution proposed in document US 2010/0219808 in which the measurement is performed at building level. A first benefit of the invention is therefore to allow for a local diagnosis of a problem which may be local, for example if the measurement performed on the modulator unit $20_n$ situated on the line portion 2g of the building $1_n$ is abnormal while it is normal for the modulator unit $20_n$ situated on the line portion 2h of the same building, and to supply the operator with a very accurate mapping of the place where the problems occur.

The solution proposed by the invention is also particularly suited to the issues of electrical line ends, which see the electrical signal degrade progressively with distance away from the transformer 3. Assume in fact that a significant frequency difference occurs in the electrical line section 2g of the building $1_n$. In the solution proposed by document US 2010/0219808, the detection of this difference will be done on the line portion 2b of the building $1_n$, and the corrective actions will be able to be taken only locally on the electrical appliances $30_n$ installed in the building $1_n$ downstream of this line portion 2b. Now, these corrective actions may prove inadequate or inappropriate. In particular, since the quality of the electrical signal is degraded in line with the power supply line, it is possible for the signal to be perfectly within the limits at the point of the power supply 2a of the building $1_1$, but no longer to be at the point of the power supply 2b, among other things because of the use of the appliances $30_1$ in the building $1_1$. By virtue of the invention, it is possible to correct a degradation of the signal by also acting upstream of the measurement point where the anomaly was detected, at a place where the quality of the signal is correct, typically, in our example, on the electrical appliances $30_1$ of the building $1_1$.

In the implementation of the invention as described previously, the difference measurements and alert generation are performed on each modulator unit $20_1$, $20_n$. Nevertheless, as a variant, in the case where the pilot units are distinct from the modulator units, it is also possible to envisage having the measurements of the differences transmitted by the modulator units $20_1$, $20_n$ to the pilot units $10_1$, $10_n$ to which they are linked, and for the generation of the alert signals following the comparisons with the threshold values to be performed by the pilot units $10_1$, $10_n$.

The invention claimed is:

1. A method for measuring and modulating in real time the electrical consumption of a plurality of electrical appliances powered from at least one electrical line of an electrical distribution network supplying a power feed signal at a nominal voltage and at a nominal frequency, said method comprising the steps of:
   measuring in real time the current consumed by each of the electrical appliances on each electrical line portion on which each electrical appliance is situated;
   extracting the frequency and the voltage of the electrical signal on each electrical line portion on which each electrical appliance is situated;
   calculating the difference in frequency by a data processing module, as an absolute value, between the extracted frequency and the nominal frequency of the distribution network and/or the difference in voltage, as an absolute value, between the extracted voltage and the nominal voltage of the electrical distribution network for each electrical line portion;
   generating an alert signal associated with an electrical line portion when the difference in frequency on this electrical line portion is greater than a predetermined frequency threshold value ($f_{threshold}$) and/or the different in voltage on this electrical line portion is greater than a predetermined voltage threshold value ($V_{threshold}$);
   transmitting the electrical consumption of each of the electrical appliances and the alert signal to an external central platform; and
   sending, by said external central platform, selective isolation commands for certain electrical appliances, regardless of the position of these electrical appliances in relation to the electrical line portion for which the alert signal was generated.

2. A system for measuring and modulating in real time the electrical consumption of a plurality of electrical appliances powered from at least one electrical line of an electrical distribution network supplying a power feed signal at a nominal voltage and at a nominal frequency, the system comprising:
   a plurality of modulator units comprising a current measurement device measuring in real time the current consumed by each of the electrical appliances on each electrical line portion on which each electrical appliance is situated, a plurality of pilot units locally exchanging data with one or more of said modulator units, and an external central platform hosted by an Internet server, exchanging data with said pilot units, wherein:
   said modulator units or said pilot units has a data processing unit extracting the frequency and the voltage of the electrical signal on each electrical line portion on which each electrical appliance is situated;
   said data processing unit calculating the difference in frequency, as an absolute value, between the extracted frequency and the nominal frequency of the distribution network and/or the difference in voltage, as an absolute value, between the extracted voltage and the nominal voltage of the electrical distribution network for each electrical line portion and generating an alert signal associated with an electrical line portion when the difference in frequency on this electrical line portion is greater than a predetermined frequency threshold value (f.sub.threshold) and/or the difference in voltage on this electrical line portion is greater than a predetermined voltage threshold value (V.sub.threshold);
   wherein the pilot units are transmitting the electrical consumption of each of the electrical appliances and the alert signal to the external central platform and wherein said external central platform is sending selective isolation commands for certain electrical appliances, regardless of the position of these electrical appliances in relation to the electrical line portion for which the alert signal was generated.

3. The system as claimed in claim 2, wherein the external central platform is for exchanging data with said pilot units via a wired communication link, an ADSL link, or a wireless communication link of GPRS, 3G or 4G type.

4. The system as claimed in claim 2, wherein said pilot units are for locally exchanging data with one or more of said modulator units via a wired communication link of powerline carrier type, or a short range radiofrequency communication link.

5. The system as claimed in claim 2, wherein each pilot unit is incorporated in a modulator unit.

\* \* \* \* \*